United States Patent
Momose et al.

(10) Patent No.: US 8,395,262 B2
(45) Date of Patent: Mar. 12, 2013

(54) SEMICONDUCTOR DEVICE AND METHOD FOR MANUFACTURING THE SAME

(75) Inventors: Fumihiko Momose, Nagano (JP); Kazumasa Kido, Matsumoto (JP); Yoshitaka Nishimura, Azumino (JP); Fumio Shigeta, Okaya (JP)

(73) Assignee: Fuji Electric Co., Ltd. (JP)

( * ) Notice: Subject to any disclaimer, the term of this patent is extended or adjusted under 35 U.S.C. 154(b) by 90 days.

(21) Appl. No.: 12/879,940

(22) Filed: Sep. 10, 2010

(65) Prior Publication Data

US 2011/0186999 A1 Aug. 4, 2011

(30) Foreign Application Priority Data

Feb. 1, 2010 (JP) ................................. 2010-019964

(51) Int. Cl.
*H01L 23/48* (2006.01)
*H01L 29/40* (2006.01)
(52) U.S. Cl. ........................................ 257/741; 438/125
(58) Field of Classification Search .................. 257/741, 257/E21.499, E23.141; 438/125
See application file for complete search history.

(56) References Cited

U.S. PATENT DOCUMENTS 7,821,130 B2 * 10/2010 Hohlfeld et al. ............... 257/734
2008/0211091 A1 9/2008 Kemper et al.

FOREIGN PATENT DOCUMENTS

JP 3524360 B2 2/2004

OTHER PUBLICATIONS

Fuji Electric Journal; vol. 83, No. 1; p. 80, Section 14; Jan. 2010; (first published Dec. 25, 2009); English translation of Section 14 attached.

* cited by examiner

*Primary Examiner* — Theresa T Doan
(74) *Attorney, Agent, or Firm* — Rossi, Kimms & McDowell LLP

(57) ABSTRACT

Hardness of bonding end portions of an external connection terminal to be bonded to circuit patterns of an insulating substrate which is not lower than 90 in Vickers hardness is disclosed. An ultrasonic welding tool is used. In the external connection terminal in which the bonding end portions are provided integrally with a bar, one of the bonding end portion located substantially in the lengthwise center of the bar is first bonded, and the other bonding end portions are bonded alternately in order toward either end. The hardness of the bonding end portions is increased so that strength of the ultrasonic welding portions is increased. Since the external connection terminal including the bonding end portions is bonded in such a manner that the bonding end portion located substantially in the center is first bonded and the other bonding end portions are then bonded in order of increasing distance substantially from the central bonding end portion, displacement of the bonding end portion in either end from its regular position can be suppressed to keep bonding strength high. In this manner, the bonding strength of the ultrasonic welding portions between the external connection terminal and the circuit patterns of the insulating substrate can be increased so that long-term reliability can be secured in a semiconductor device.

3 Claims, 3 Drawing Sheets

SEMICONDUCTOR DEVICE AND METHOD FOR MANUFACTURING THE SAME

BACKGROUND OF THE INVENTION

A. Field of the Invention

The present invention relates to a semiconductor device and a method for manufacturing the same, and particularly relates to a large-sized and high-capacity semiconductor device with improved reliability in a joint portion between a circuit pattern on an insulating substrate and an external connection terminal, and a method for manufacturing the same.

B. Description of the Related Art

A semiconductor device for use in electric power conversion has an insulating substrate in which circuit patterns made of copper or the like are, for example, formed in an upper surface of a plate-like insulating member made of ceramic, and back-surface electrodes of semiconductor elements are bonded to the circuit patterns by soldering. In the configuration of such a semiconductor device, external connection terminals are placed to be separate from the insulating substrate. The external connection terminals are connected to the circuit patterns by wire bonding. In addition, copper foil formed on the back surface of the insulating substrate is connected to a copper base plate by soldering so that the insulating substrate can be fixed to the base plate.

Large-scale power conversion systems are requested to save space. To this end, semiconductor devices must be made large in scale and high in capacity to reduce the number of semiconductor devices used per unit power. In the configuration of a high-capacity semiconductor device where external connection terminals are connected to circuit patterns by wire bonding, a large number of wires must be used in order to secure a required current capacity. Thus, a method for bonding the external connection terminals directly to the circuit patterns is used.

The external connection terminals and the circuit patterns are often bonded by soldering. However, according to the bonding by soldering, it has been difficult to secure reliability in the bonding portions because the semiconductor device is made larger in scale and higher in capacity. That is, a base plate is deformed due to heat generated when the semiconductor is in use. As the semiconductor device increases in scale, stress on the bonding portions of the external connection terminals becomes very high due to the deformation. In addition, bonding by soldering requires heating to fuse solder. Due to the heating, the base plate may be deformed. When a plurality of bonding portions are formed integrally with the external connection terminals, the distance between each external connection terminal and each circuit pattern may be changed in accordance with bonding positions. In addition, the electric resistance of the solder is about one order of magnitude greater than that of the external connection terminals or the circuit patterns. If the semiconductor device is made higher in capacity, the amount of Joule heat generated in the solder will increase and that will increase loss when the power conversion system is in operation.

There is known a large-scale high-capacity semiconductor device in which external connection terminals are bonded to circuit patterns by ultrasonic welding in place of solder bonding (for example, see US Patent No. 2008/0211091). The ultrasonic welding is performed by applying horizontal ultrasonic vibration to a bonding end portion of each external connection terminal while applying a vertical load to a bonding interface between the external connection terminal and the circuit pattern. Ultrasonic welding can be performed at a normal temperature, in a short time and in the atmosphere, and high reliability in bonding portions can be secured due to solid state bonding between metals of one and the same material.

When a semiconductor device has a high capacity, each external connection terminal must be thickened to increase its sectional area. For example, when the external connection terminal uses a copper plate 0.8 mm thick, it is known that the reliability in the ultrasonic welding portion cannot be ensured if the Vickers hardness of the external connection terminal is higher than 80 (see Japanese Patent No. 3524360).

However, when low-hardness external connection terminals are used, the strength of the semiconductor device as a whole including the external connection terminals cannot be ensured. Particularly when the external connection terminals are further thickened to increase the capacity, a problem with respect to the long-term reliability of the semiconductor device arises, and it deteriorates due to the insufficient strength.

In addition, due to increases in the scale of the semiconductor device, external connection terminals with bonding end portions formed integrally with long bars to protrude thereon may be ultrasonically bonded with circuit patterns formed in predetermined positions on an insulating substrate. In this case, due to the processing accuracy of the external connection terminals or the assembling accuracy in bonding the external connection terminals, it is difficult to align the bonding positions thereof. Thus, there arises a problem that the bonding strength deteriorates due to the misalignment of the bonding positions to lower the long-term reliability of the semiconductor device.

The present invention is directed to overcoming or at least reducing the effects of one or more of the problems set forth above.

SUMMARY OF THE INVENTION

The present invention was developed in consideration of the aforementioned problems. The invention provides a semiconductor device having long-term reliability in ultrasonic welding portions, and a method for manufacturing the semiconductor device.

In order to solve the aforementioned problems, the invention provides a semiconductor device including: an insulating substrate; a power semiconductor chip which is mounted on the insulating substrate; a circuit pattern which is formed in the insulating substrate; and an external connection terminal which is bonded with the circuit pattern by ultrasonic welding, wherein the external connection terminal is made of copper to secure at least 90 in Vickers hardness as the hardness of at least each bonding end portion to be bonded with the circuit pattern.

In addition, the invention provides a method for manufacturing a semiconductor device including the steps of: mounting a power semiconductor chip on an insulating substrate; and bonding an external connection terminal to a circuit pattern by ultrasonic welding, the circuit pattern being formed in the insulating substrate, wherein the external connection terminal made of copper and having a plurality of bonding end portions with at least 90 in Vickers hardness arrayed in one and the same direction is bonded with the circuit pattern on the insulating substrate in such a manner that one of the bonding end portions disposed substantially in the center is bonded initially and the other bonding end portions on opposite sides of the central bonding end portion are bonded alternately one by one in order toward either end.

According to such a semiconductor device and the method for manufacturing the same, due to the hardness of the bonding end portions being increased to at least 90 in Vickers hardness, the strength of the semiconductor device when the external connection terminal is bonded with the circuit pattern can be increased. In addition, even in the case where the bonding end portions are not arrayed linearly and accurately, displacements of the bonding end portions on the opposite sides from the bonding position located substantially in the center can be reduced because the external connection terminal including the bonding end portions is bonded in such a manner that the bonding end portion located substantially in the center is bonded first and the other bonding end portions are then bonded in order of increasing distance substantially from the central bonding end portion. Thus, bonding strength in the bonding surface can be increased.

According to the semiconductor device configured thus and the method for manufacturing the same, due to the hardness being increased to at least about 90 in Vickers hardness, the strength of the whole of the semiconductor device including the external connection terminal is increased. Thus, there is an advantage that the long-term reliability of the semiconductor device can be improved. In addition, the external connection terminal in which bonding end portions are arrayed linearly is bonded in such a manner that the bonding end portion disposed substantially in the center in the array direction is first bonded and the other bonding end portions are bonded one by one in order of increasing distance substantially from the central bonding end portion. Accordingly, the bonding positions of the bonding end portions on the opposite ends have small misalignment from their regular positions, while reduction in bonding area can be suppressed to keep high bonding strength in the bonding surface. It is therefore possible to provide a semiconductor device having long-term reliability.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

An embodiment of the invention will be described below in detail with reference to the drawings.

Figure 1:
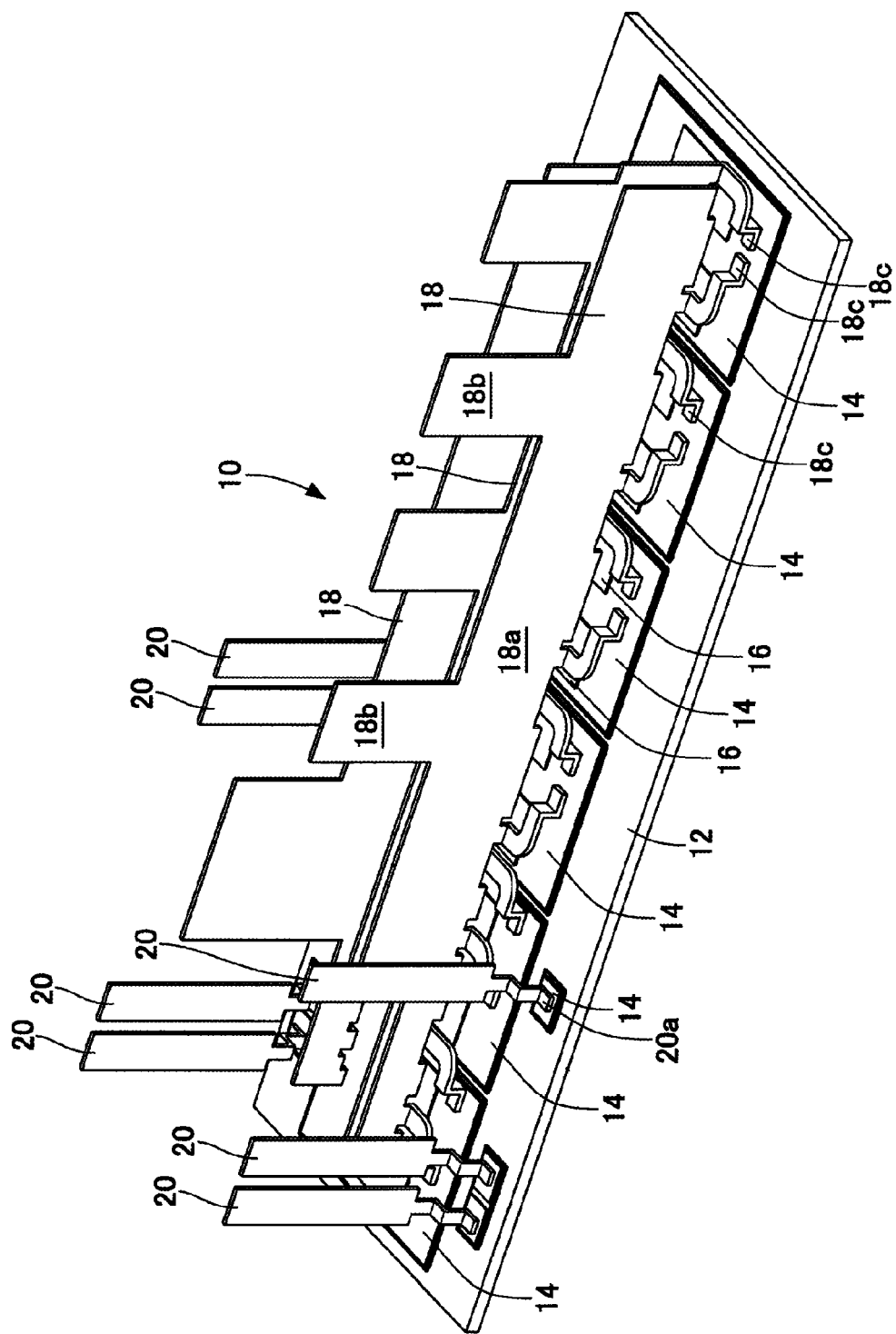
FIG. 1 is a perspective view showing the inside of a semiconductor device according to an embodiment of the invention.
Figure 2:
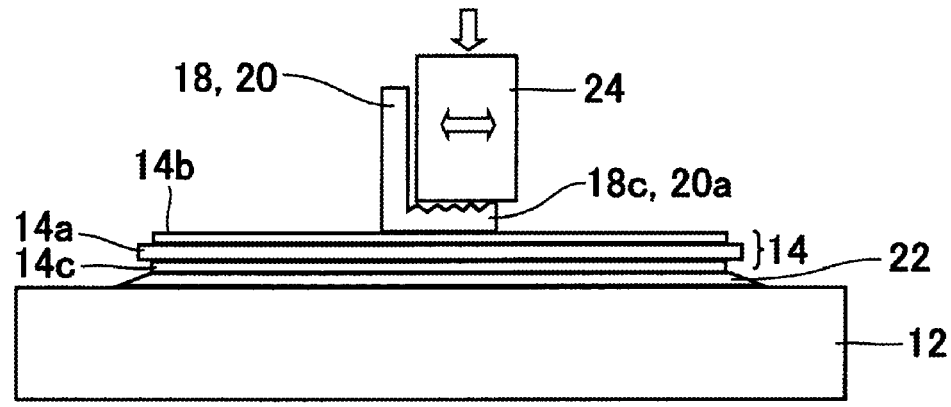
FIG. 2 is an explanatory view showing an ultrasonic welding operation of an external connection terminal.

FIG. 1 is a perspective view showing the inside of a semiconductor device according to the embodiment of the invention, and FIG. 2 is an explanatory view showing an ultrasonic welding operation of an external connection terminal.

Semiconductor device 10 has base plate 12, insulating substrates 14 mounted on the top of the base plate 12, power semiconductor chips 16 and external connection terminals 18 and 20 mounted on insulating substrates 14, and a cover (not shown) covering those parts.

Base plate 12 is formed out of a thick plate, which is made of a high thermal conductive material such as copper. The configuration of each insulating substrate 14 is shown in FIG. 2. Insulating substrate 14 has plate-like insulating member 14a, made of ceramic. Circuit patterns 14b made of copper or the like are formed on the top of insulating member 14a. Copper foil 14c is formed on the bottom of insulating member 14a. Copper foil 14c is bonded to base plate 12 by solder 22. In FIG. 1, circuit patterns 14b are not shown in detail to form circuit, and electric connections etc. between insulating substrates 14 by bonding wires also are not shown.

Power semiconductor chips 16 may be formed as power semiconductor elements such as IGBTs (Insulated Gate Bipolar Transistors), freewheeling diodes, etc. Back-surface electrodes of those elements are bonded to circuit patterns 14b of insulating substrates 14 by soldering. FIG. 1 shows an example where 12 IGBTs and 12 freewheeling diodes are mounted.

One end of each external connection terminal 18, 20 is made to protrude to the outside from the cover while the other end thereof is ultrasonically bonded with circuit patterns 14b in insulating substrates 14. External connection terminals 18 are provided for a main circuit, and external connection terminals 20 are provided for a control circuit. External connection terminals 18 for the main circuit also serve as internal connection among power semiconductor chips 16. To this end, each external connection terminal 18 has belt-like long bar 18a, terminal portions 18b and a plurality of bonding end portions 18c. Each terminal portion 18b extends upwards from bar 18a so as to protrude to the outside from the cover. Bonding end portions 18c extend downwards from bar 18a and are bonded with circuit patterns 14b. Bar 18a, terminal portions 18b and bonding end portions 18c are formed integrally.

Each external connection terminal 18, 20 is formed in the following manner to increase the capacity. For example, a copper plate 1.0 mm thick is punched into a predetermined shape by pressing, and bent into a predetermined shape. Incidentally, hardening treatment is performed on bonding end portions 18c and 20a of external connection terminals 18 and 20 to be bonded with circuit patterns 14b, so as to increase the hardness thereof to at least about 90 or more preferably to about 110 in Vickers hardness. For example, the hardening treatment is carried out by heat treatment based on quenching. The hardening treatment is not limited to quenching, but any hardening treatment including the material may be used as long as the hardness of bonding end portions 18c and 20a can be increased. In addition, the hardening treatment may be performed not partially only on bonding end portions 18c and 20a of external connection terminals 18 and 20, but wholly on external connection terminals 18 and 20.

In addition, the tensile strength of the terminal material itself also can be increased by the hardening treatment performed on external connection terminals 18 and 20. For example, if bonding end portion 18c, 20a with a Vickers hardness of 55 is bonded, the pulling strength thereof will be about 481 N. In contrast, when bonding end portion 18c, 20a with a Vickers hardness of 100 is bonded, the pulling strength thereof will reach 525 N. Thus, there is an effect that the breaking strength of the terminal can be increased.

In the invention, "copper" represents either copper, which inevitably contains a small amount of impurities, or a copper alloy. Particularly, of copper alloys, oxygen-free copper is preferred.

As shown in FIG. 2, bonding end portion 18c, 20a of each external connection terminal 18, 20 whose hardness has been increased is ultrasonically bonded to circuit pattern 14b of insulating substrate 14. That is, in the state where external connection terminal 18, 20 is retained by a jig, bonding end portion 18c, 20a is moved down to abut against circuit pattern 14b of insulating substrate 14, and ultrasonic welding tool 24 is disposed on bonding end portion 18c, 20a. Ultrasonic welding tool 24 applies horizontal ultrasonic vibration with a frequency of 19.15 kHz and amplitude of about 50 micrometers to the bonding interface between bonding end portion 18c, 20a and circuit pattern 14b for 500 milliseconds while applying a vertical load of about 500 N thereto. Thus, ultrasonic welding is performed.

When bonding end portion 18c, 20a of external connection terminal 18, with high hardness is ultrasonically bonded to circuit pattern 14b of insulating substrate 14 with relatively low Vickers hardness (e.g. about 30 to 50), the strength of external connection terminal 18, 20 relative to circuit pattern 14b can be increased by 5 to 20% as compared with the case where the terminal hardness is made not higher than 80 in Vickers hardness.

In addition, under the aforementioned bonding conditions, the bonding strength of the bonding interface can be made higher than the breaking strength of the base material. That is, as a result of a pulling test carried out on bonded external connection terminal 18, 20, external connection terminal 18, 20 is broken not in the bonding interface but in the base material. Thus, the strength can be made higher than the breaking point of the bonding interface.

When semiconductor device 10 is increased in scale, external connection terminals 18 internally used for the main circuit are also increased in scale. For example, as shown in FIG. 1, assume that semiconductor device 10 includes the 12 power semiconductor chips 16 with a current capacity of 1,000 amperes. In this case, the length of bar 18a of each external connection terminal 18 may reach twenty and several centimeters. Accordingly, when there is a problem in the processing accuracy of external connection terminal 18 or the assembling accuracy of external connection terminal 18 bonded ultrasonically, misalignment may occur in the bonding position where external connection terminal 18 is ultrasonically bonded. Next, description will be made on a method for reducing the misalignment of such a bonding position.

Figure 3A:
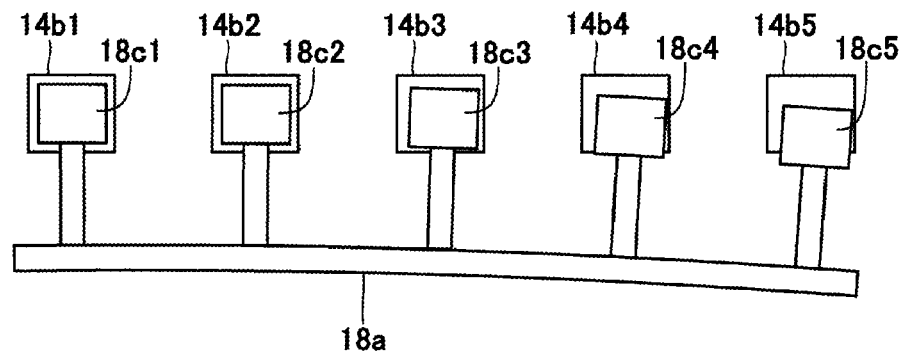
FIGS. 3A-3B are plan views each showing a bonding state between an external connection terminal curved horizontally and a circuit pattern, FIG. 3A showing the bonding state according to a background-art manufacturing method, FIG. 3B showing the bonding state according to a manufacturing method of the invention.
Figure 3B:
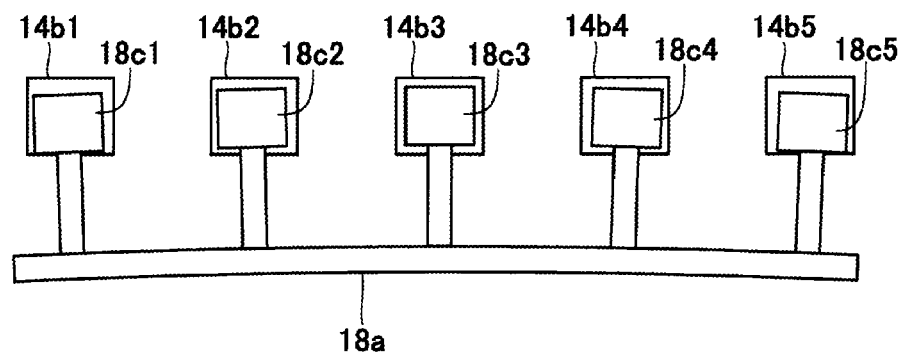
Figure 4A:
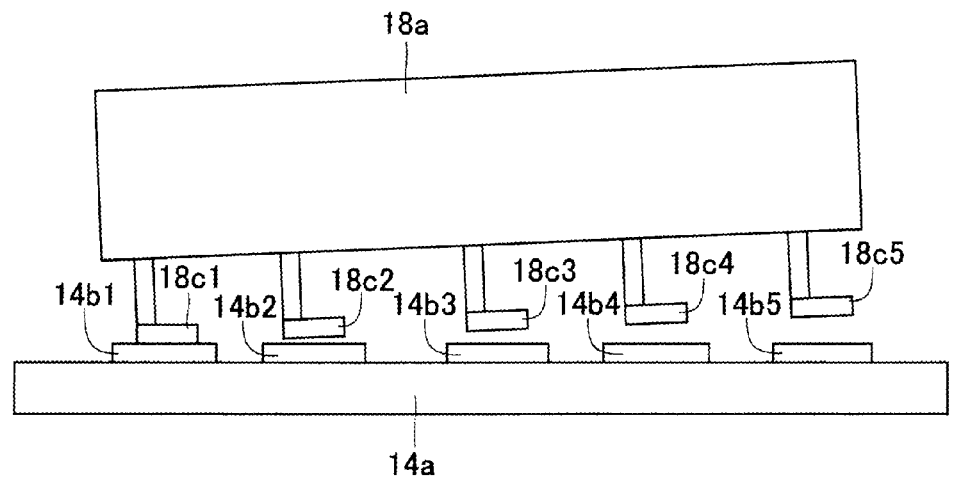
FIG. 4A-4B are side views each showing a bonding state between an external connection terminal and a circuit pattern, FIG. 4A showing the bonding state according to the background-art manufacturing method, FIG. 4B showing the bonding state according to the manufacturing method of the invention.
Figure 4B:
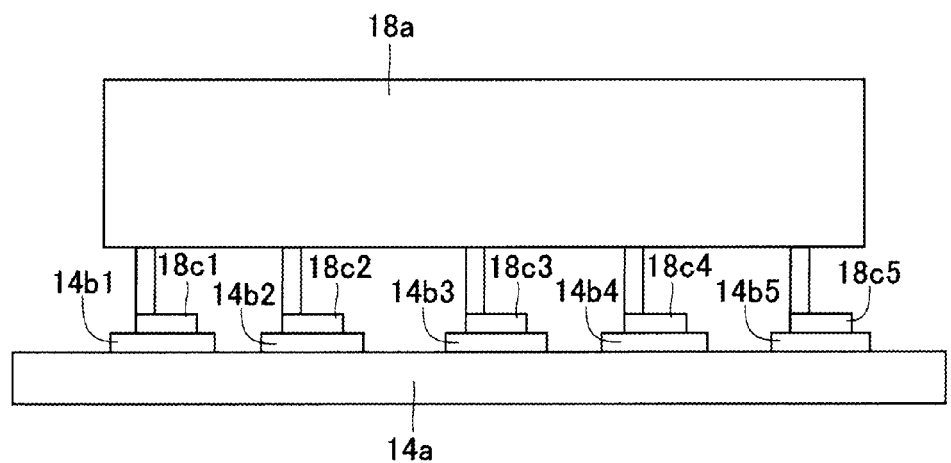

FIGS. 3A-3B are plan views each showing a bonding state between an external connection terminal curved horizontally and a circuit pattern. FIG. 3A shows the bonding state according to a background-art manufacturing method, and FIG. 3B shows the bonding state according to a manufacturing method of the invention. FIGS. 4A-4B are side views each showing a bonding state between an external connection terminal and a circuit pattern. FIG. 4A shows the bonding state according to the background-art manufacturing method, and FIG. 4B shows the bonding state according to the manufacturing method of the invention.

According to the background-art method for manufacturing semiconductor device 10, external connection terminals 18 in each of which bar 18a and bonding end portions 18c are formed integrally are ultrasonically bonded to circuit patterns 14b of the insulating substrates 14 sequentially in order from bonding end portion 18c located in one end.

Here, description will be made of the case where five bonding end portions 18c1 to 18c5 are bonded to five circuit patterns 14b1 to 14b5 respectively. When bar 18a is curved, bonding end portion 18c1 located in one end is first positioned accurately and bonded as shown in FIG. 3A. On this occasion, the second and following bonding end portions 18c2 to 18c5 are displaced slightly from their regular positions. Thus, final bonding end portion 18c5 is displaced largely from its regular position correspondingly to the accumulated displacements of bonding end portions 18c2 to 18c5. The displacement of bonding end portion 18c5 will be more conspicuous if the length of bar 18a is longer.

Assume that external connection terminal 18 is processed accurately, and bar 18a is not curved. Even in this case, there may be a problem in the assembling accuracy of external connection terminal 18 bonded to insulating substrates 14 or the flatness of each insulating substrate 14. When bonding end portion 18c1 on one end side is first bonded to circuit pattern 14b1, an end portion on the other end side may float as shown in FIG. 4A. As a result, in order to perform the next bonding, ultrasonic welding tool 24 must prepare ultrasonic welding for bonding end portion 18c2 floating away from circuit pattern 14b2. This bonding is performed on bonding end portion 18c2 unstably positioned with respect to circuit pattern 14b2, so as to displace bonding end portion 18c2 largely from its regular position.

On the other hand, in the manufacturing method according to the invention, a bonding end portion located near the lengthwise center of bar 18a, that is, the third bonding end portion 18c3 in the example shown in FIGS. 3A-3B and 4A-4B, is first positioned accurately and bonded. Next, the left and right bonding end portions 18c2 and 18c4 adjacent to bonding end portion 18c3 are bonded one by one, and the bonding end portions 18c1 and 18c5 located further outside bonding end portions 18c2 and 18c4 are bonded one by one. Thus, the bonding end portion located in the lengthwise center of bar 18a is first bonded, and the other bonding end portions located on opposite sides of the central bonding end portion are then bonded alternately one by one in order toward either end. For example, in the example shown in FIGS. 3A-3B and 4A-4B, bonding is performed on bonding end portions 18c3, 18c2, 18c4, 18c5 and 18c1 in this order.

The aforementioned example has been described in the case where the five bonding end portions 18c1 to 18c5 are bonded to the five circuit patterns 14b1 to 14b5. However, for example, even when the number of circuit patterns and the number of bonding end portions are six, it will go well if the bonding end portion in the center is bonded first and the other bonding end portions are then bonded sequentially in order of increasing distance from the central bonding end portion. That is, when the number of bonding end portions is an odd number (2n+1), it will go well if the $(n+1)^{th}$ bonding end portion from one end is first bonded and the $n^{th}$ and $n+2^{th}$ bonding end portions are then bonded alternately one by one. When the number of bonding end portions is an even number (2m), it will go well if the $m^{th}$ bonding end portion from one end is first bonded and the $m+1^{th}$ and $m-1^{th}$ bonding end portions are then bonded alternately one by one (n and m are positive integers).

First bonding is started in the bonding end portion in the longitudinal center of bar 18a so that the displacement of the bonding position in either end of bar 18a can be halved without correcting the positioning. Since the displacements of the bonded portions from their regular positions are reduced to enhance the bonding accuracy, reduction in bonding strength can be suppressed so that the long-term reliability of the semiconductor device 10 can be kept.

Thus, a semiconductor device has been described according to the present invention. Many modifications and variations may be made to the techniques and structures described and illustrated herein without departing from the spirit and scope of the invention. Accordingly, it should be understood that the devices, methods and apparatuses described herein are illustrative only and are not limiting upon the scope of the invention.

This application is based on and claims priority to Japanese Patent Application 2010-019964, filed on Feb. 1, 2010. The disclosure of the priority application in its entirety, including the drawings, claims, and the specification thereof, is incorporated herein by reference.

What is claimed is:

1. A semiconductor device comprising:
an insulating substrate;
a power semiconductor chip which is mounted on the insulating substrate;
a circuit pattern which is formed in the insulating substrate; and
an external connection terminal which is bonded to the circuit pattern by ultrasonic welding; wherein:
the external connection terminal is made of copper to secure at least 90 in Vickers hardness as a hardness of at least each bonding end portion to be bonded to the circuit pattern,
wherein the external connection terminal includes a belt-like bar, at least one terminal portion extending from one width-direction side of the bar, and the bonding end portions extended from the other width-direction side of the bar and arrayed in a length direction of the bar, the bar, the terminal portion and the bonding end portions being formed integrally, the whole of the external connection terminal or part of the external connection terminal including the bonding end portions being subjected to hardening treatment.

2. A method for manufacturing a semiconductor device, comprising the steps of:
mounting a power semiconductor chip on an insulating substrate; and
bonding an external connection terminal to a circuit pattern by ultrasonic welding, the circuit pattern being formed in the insulating substrate; wherein:
the external connection terminal made of copper and having a plurality of bonding end portions with at least 90 in Vickers hardness arrayed in one and the same direction is bonded to the circuit pattern on the insulating substrate in such a manner that one of the bonding end portions disposed substantially centrally is bonded initially and the other bonding end portions on opposite sides of the central bonding end portion are bonded alternately, one by one, in order toward either end
wherein the external connection terminal includes a belt-like bar, at least one terminal portion extending from one width-direction side of the bar, and the bonding end portions extended from the other width-direction side of the bar and arrayed in a length direction of the bar, the bar, the terminal portion and the bonding end portions being formed integrally, the whole of the external connection terminal or part of the external connection terminal including the bonding end portions being subjected to hardening treatment.

3. A method for manufacturing a semiconductor device according to claim 2, wherein the ultrasonic welding is performed by applying horizontal ultrasonic vibration with a frequency of 19.15 kHz and an amplitude of about 50 micrometers to each of the bonding end portions 1.0 mm thick for 500 milliseconds while applying a vertical load of about 500 N to a bonding interface to the bonding end portion.

* * * * *